US009252814B2

(12) United States Patent
Gara et al.

(10) Patent No.: US 9,252,814 B2
(45) Date of Patent: *Feb. 2, 2016

(54) COMBINED GROUP ECC PROTECTION AND SUBGROUP PARITY PROTECTION

(71) Applicant: International Business Machines Corporation, Armonk, NY (US)

(72) Inventors: Alan Gara, Mount Kisco, NY (US); Dong Chen, Croton on Hudson, NY (US); Philip Heidelberger, Cortlandt Manor, NY (US); Martin Ohmacht, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

This patent is subject to a terminal disclaimer.

(21) Appl. No.: 13/918,127

(22) Filed: Jun. 14, 2013

(65) Prior Publication Data

US 2013/0283123 A1 Oct. 24, 2013

Related U.S. Application Data

(62) Division of application No. 11/768,527, filed on Jun. 26, 2007, now Pat. No. 8,468,416.

(51) Int. Cl.
*H03M 13/00* (2006.01)
*H03M 13/29* (2006.01)
*H03M 1/06* (2006.01)
*G06F 11/10* (2006.01)
*H03M 13/13* (2006.01)
*H03M 13/27* (2006.01)

(52) U.S. Cl.
CPC ............ *H03M 13/29* (2013.01); *G06F 11/1064* (2013.01); *H03M 1/0687* (2013.01); *H03M 13/13* (2013.01); *H03M 13/271* (2013.01); *H03M 13/2707* (2013.01); *G06F 2212/403* (2013.01)

(58) Field of Classification Search
USPC .................................................. 714/758, 801
See application file for complete search history.

(56) References Cited

U.S. PATENT DOCUMENTS

| | | | |
|---|---|---|---|
| 4,777,595 A | 10/1988 | Strecker et al. | |
| 5,063,562 A | 11/1991 | Barzilai et al. | |
| 5,142,422 A | 8/1992 | Zook et al. | |

(Continued)

OTHER PUBLICATIONS

Definition of "mechanism", Oxford English Dictionary, http://dictionary.oed.com/cgi/entry/00304337?query_type=word&queryword=mechanism&first=1&max_to_show=10&sort_type=alpha&result_place=2&search_id=y2atElGc-11603&hilite+00304337.

(Continued)

*Primary Examiner* — M. Mujtaba K Chaudry
(74) *Attorney, Agent, or Firm* — Scully, Scott, Murphy & Presser, P.C.; Daniel P. Morris, Esq.

(57) ABSTRACT

A method and system are disclosed for providing combined error code protection and subgroup parity protection for a given group of n bits. The method comprises the steps of identifying a number, m, of redundant bits for said error protection; and constructing a matrix P, wherein multiplying said given group of n bits with P produces m redundant error correction code (ECC) protection bits, and two columns of P provide parity protection for subgroups of said given group of n bits. In the preferred embodiment of the invention, the matrix P is constructed by generating permutations of m bit wide vectors with three or more, but an odd number of, elements with value one and the other elements with value zero; and assigning said vectors to rows of the matrix P.

10 Claims, 2 Drawing Sheets

(56) References Cited

U.S. PATENT DOCUMENTS

| | | | |
|---|---|---|---|
| 5,349,587 A | 9/1994 | Nadeau-Dostie et al. | |
| 5,353,412 A | 10/1994 | Douglas et al. | |
| 5,452,432 A | 9/1995 | Macachor | |
| 5,524,220 A | 6/1996 | Verma et al. | |
| 5,634,007 A | 5/1997 | Calta et al. | |
| 5,659,710 A | 8/1997 | Sherman et al. | |
| 5,708,779 A | 1/1998 | Graziano et al. | |
| 5,761,464 A | 6/1998 | Hopkins | |
| 5,796,735 A | 8/1998 | Miller et al. | |
| 5,809,278 A | 9/1998 | Watanabe et al. | |
| 5,825,748 A | 10/1998 | Barkey et al. | |
| 5,844,918 A * | 12/1998 | Kato | 714/751 |
| 5,890,211 A | 3/1999 | Sokolov et al. | |
| 5,917,828 A | 6/1999 | Thompson | |
| 6,023,732 A | 2/2000 | Moh et al. | |
| 6,061,511 A | 5/2000 | Marantz et al. | |
| 6,072,781 A | 6/2000 | Feeney et al. | |
| 6,122,715 A | 9/2000 | Palanca et al. | |
| 6,185,214 B1 | 2/2001 | Schwartz et al. | |
| 6,219,300 B1 | 4/2001 | Tamaki | |
| 6,223,322 B1 | 4/2001 | Michigami et al. | |
| 6,263,397 B1 | 7/2001 | Wu et al. | |
| 6,295,571 B1 | 9/2001 | Scardamalia et al. | |
| 6,311,249 B1 | 10/2001 | Min et al. | |
| 6,324,495 B1 | 11/2001 | Steinman | |
| 6,356,106 B1 | 3/2002 | Greeff et al. | |
| 6,366,984 B1 | 4/2002 | Carmean et al. | |
| 6,442,162 B1 | 8/2002 | O'Neill et al. | |
| 6,466,227 B1 | 10/2002 | Pfister et al. | |
| 6,564,331 B1 | 5/2003 | Joshi | |
| 6,594,234 B1 | 7/2003 | Chard et al. | |
| 6,598,123 B1 | 7/2003 | Anderson et al. | |
| 6,601,144 B1 | 7/2003 | Arimilli et al. | |
| 6,631,447 B1 | 10/2003 | Morioka et al. | |
| 6,631,485 B1 * | 10/2003 | Morley et al. | 714/701 |
| 6,647,428 B1 | 11/2003 | Bannai et al. | |
| 6,662,305 B1 | 12/2003 | Salmon et al. | |
| 6,675,349 B1 | 1/2004 | Chen | |
| 6,718,506 B1 | 4/2004 | Sebastian et al. | |
| 6,735,174 B1 | 5/2004 | Hefty et al. | |
| 6,775,693 B1 | 8/2004 | Adams | |
| 6,799,232 B1 | 9/2004 | Wang | |
| 6,880,028 B2 | 4/2005 | Kurth | |
| 6,889,266 B1 | 5/2005 | Stadler | |
| 6,894,978 B1 | 5/2005 | Hashimoto | |
| 6,954,887 B2 | 10/2005 | Wang et al. | |
| 6,986,026 B2 | 1/2006 | Roth et al. | |
| 7,007,123 B2 | 2/2006 | Golla et al. | |
| 7,058,826 B2 | 6/2006 | Fung | |
| 7,065,594 B2 | 6/2006 | Ripy et al. | |
| 7,143,219 B1 | 11/2006 | Chaudhari et al. | |
| 7,191,373 B2 | 3/2007 | Wang et al. | |
| 7,239,565 B2 | 7/2007 | Liu | |
| 7,280,477 B2 | 10/2007 | Jeffries et al. | |
| 7,298,746 B1 | 11/2007 | De La Iglesia et al. | |
| 7,363,629 B2 | 4/2008 | Springer et al. | |
| 7,373,420 B1 | 5/2008 | Lyon | |
| 7,401,245 B2 | 7/2008 | Fischer et al. | |
| 7,454,640 B1 | 11/2008 | Wong | |
| 7,454,641 B2 | 11/2008 | Connor et al. | |
| 7,461,236 B1 | 12/2008 | Wentzlaff | |
| 7,463,529 B2 | 12/2008 | Matsubara | |
| 7,539,845 B1 | 5/2009 | Wentzlaff et al. | |
| 7,613,971 B2 | 11/2009 | Asaka | |
| 7,620,791 B1 | 11/2009 | Wentzlaff et al. | |
| 7,698,581 B2 | 4/2010 | Oh | |
| 7,904,782 B2 * | 3/2011 | Huang et al. | 714/752 |
| 7,930,611 B2 * | 4/2011 | Huang et al. | 714/752 |
| 2001/0055323 A1 | 12/2001 | Rowett et al. | |
| 2002/0078420 A1 | 6/2002 | Roth et al. | |
| 2002/0087801 A1 | 7/2002 | Bogin et al. | |
| 2002/0100020 A1 | 7/2002 | Hunter et al. | |
| 2002/0129086 A1 | 9/2002 | Garcia-Luna-Aceves et al. | |
| 2002/0138801 A1 | 9/2002 | Wang et al. | |
| 2002/0156979 A1 | 10/2002 | Rodriguez | |
| 2002/0184159 A1 | 12/2002 | Tadayon et al. | |
| 2003/0007457 A1 | 1/2003 | Farrell et al. | |
| 2003/0028749 A1 | 2/2003 | Ishikawa et al. | |
| 2003/0050714 A1 | 3/2003 | Tymchenko | |
| 2003/0050954 A1 | 3/2003 | Tayyar et al. | |
| 2003/0074616 A1 | 4/2003 | Dorsey | |
| 2003/0105799 A1 | 6/2003 | Khan et al. | |
| 2003/0163649 A1 | 8/2003 | Kapur et al. | |
| 2003/0177335 A1 | 9/2003 | Luick | |
| 2003/0188053 A1 | 10/2003 | Tsai | |
| 2003/0235202 A1 | 12/2003 | Van Der Zee et al. | |
| 2004/0003184 A1 | 1/2004 | Safranek et al. | |
| 2004/0019730 A1 | 1/2004 | Walker et al. | |
| 2004/0024925 A1 | 2/2004 | Cypher et al. | |
| 2004/0073780 A1 | 4/2004 | Roth et al. | |
| 2004/0103218 A1 | 5/2004 | Blumrich et al. | |
| 2004/0210694 A1 | 10/2004 | Shenderovich | |
| 2004/0243739 A1 | 12/2004 | Spencer | |
| 2005/0007986 A1 | 1/2005 | Malladi et al. | |
| 2005/0053057 A1 | 3/2005 | Deneroff et al. | |
| 2005/0076163 A1 | 4/2005 | Malalur | |
| 2005/0160238 A1 | 7/2005 | Steely et al. | |
| 2005/0216613 A1 | 9/2005 | Ganapathy et al. | |
| 2005/0229081 A1 | 10/2005 | Lin et al. | |
| 2005/0251613 A1 | 11/2005 | Kissell | |
| 2005/0270886 A1 | 12/2005 | Takashima | |
| 2005/0273564 A1 | 12/2005 | Lakshmanamurthy et al. | |
| 2006/0050737 A1 | 3/2006 | Hsu | |
| 2006/0080513 A1 | 4/2006 | Beukema et al. | |
| 2006/0206635 A1 | 9/2006 | Alexander et al. | |
| 2006/0248367 A1 | 11/2006 | Fischer et al. | |
| 2007/0055832 A1 | 3/2007 | Beat | |
| 2007/0133536 A1 | 6/2007 | Kim et al. | |
| 2007/0168803 A1 | 7/2007 | Wang et al. | |
| 2007/0174529 A1 | 7/2007 | Rodriguez et al. | |
| 2007/0195774 A1 | 8/2007 | Sherman et al. | |
| 2008/0147987 A1 | 6/2008 | Cantin et al. | |
| 2008/0168329 A1 * | 7/2008 | Han et al. | 714/764 |
| 2008/0222480 A1 | 9/2008 | Huang et al. | |
| 2008/0222481 A1 | 9/2008 | Huang et al. | |

OTHER PUBLICATIONS

Almasi, et al., "MPI on BlueGene/L: Designing an Efficient General Purpose Messaging Solution for a Large Cellular System," IBM Research Report RC22851 (W037-150) Jul. 22, 2003.

Almasi, et al.,"Optimization of MPI Collective Communication on BlueGene/L Systems," ICS'05, Jun. 20-22, 2005, Boston, MA.

Gara, et al., "Overview of the Blue Gene/L system architecture," IBM J. Res. & Dev., vol. 49, No. 2/3, Mar./May 2005, pp. 195-212.

Huang, et al., "Performance Evaluation of Adaptive MPI," PPoPP'06, Mar. 29-31, 2006, New York, New York.

MPI (Message Passing Interface) standards documents, errata, and archives http://www.mpi-forum.org visited Jun. 16, 2007 (Sections 4.2, 4.4 and 10.4).

David Chaiken, Craig Fields, Kiyoshi Kurihara, Anant Agarwal, Directory-Based Cache Coherence in Large-Scale Multiprocessors, Computer, v.23 n.6, p. 49-58, Jun. 1990.

Michel, Dubois, Christoph Scheurich, Faye A. Briggs, Synchronization, Coherence, and Event Ordering in Multiprocessors, Computer, v.21 n.2, p. 9-21, Feb. 1988.

Giampapa, et al., "Blue Gene/L advanced diagnostics environment," IBM J. Res. & Dev., vol. 49, No. 2/3, Mar./May 2005, pp. 319-331.

IBM Journal of Research and Development, Special Double Issue on Blue Gene, vol. 49, Nos. 2/3, Mar./May 2005 ("Preface").

IBM Journal of Research and Development, Special Double Issue on Blue Gene, vol. 49, Nos. 2/3, Mar./May 2005 ("Intro").

"Intel 870: A Building Block for Cost-Effective, Scalable Servers", Faye Briggs, Michel et al., pp. 36-47, Mar.-Apr. 2002.

Pande, et al., Performance Evaluation and Design Trade-Offs for Network-On-Chip Interconnect Architectures, 2005, IEEE, pp. 1025-1040.

\* cited by examiner

P=

100000011
010000011
110000001
100010001
010010001
110010000
100011000
010011000
110001000
100001100
010001100
110000100
100000110
010000110
110000010
100000101
010000101
110000111
100010010
010010010
110010011
100001001
010001001
110011001
100010100
010010100
110011100
100001010
010001010
110001110
100001111
010001111
001000011
000100011
001100001
001010001
000110001
001110000
001011000
000111000
001101000
001001100
000101100
001100100
001000110
000100110
001100010
001000101
000100101
001100111
001010010
000110010
001110011
001001001
000101001
001111001
001010100
000110100
001111100
001001010
000101010
001101110
001001111
000101111

Cache line tag

| Valid | Address Tag | ... | Parity Protected |

Cache line data, 1024b data + 144b ECC

| 64b data | 9b ECC | 64b data | 9b ECC | ... | 64b data | 9b ECC |

COMBINED GROUP ECC PROTECTION AND SUBGROUP PARITY PROTECTION

CROSS-REFERENCE TO RELATED APPLICATIONS

This application is a divisional application of copending U.S. patent application Ser. No. 11/768,527, filed Jun. 26, 2007, the entire content and disclosure of which is hereby incorporated herein by reference.

The present invention is related to the following commonly-owned, co-pending United States Patent Applications filed on even date herewith, the entire contents and disclosure of each of which is expressly incorporated by reference herein as if fully set forth herein. U.S. patent application Ser. No. 11/768,777, now U.S. Pat. No. 8,230,433 issued Jul. 24, 2012 for "A SHARED PERFORMANCE MONITOR IN A MULTIPROCESSOR SYSTEM"; U.S. patent application Ser. No. 11/768,645, now U.S. Pat. No. 8,258,490 issued Sep. 4, 2012 for "OPTIMIZED COLLECTIVES USING A DMA ON A PARALLEL COMPUTER"; U.S. patent application Ser. No. 11/768,781, now U.S. Pat. No. 7,694,035 issued Apr. 6, 2012, for "DMA SHARED BYTE COUNTERS IN A PARALLEL COMPUTER"; U.S. patent application Ser. No. 11/768,784, now U.S. Pat. No. 7,788,334 issued Aug. 31, 2010 for "MULTIPLE NODE REMOTE MESSAGING"; U.S. patent application Ser. No. 11/768,697, now U.S. Pat. No. 8,103,832 issued Jan. 24, 2012 for "A METHOD AND APPARATUS OF PREFETCHING STREAMS OF VARYING PREFETCH DEPTH"; U.S. patent application Ser. No. 11/768,532, now U.S. Pat. No. 7,877,551 issued Jan. 25, 2011, for "PROGRAMMABLE PARTITIONING FOR HIGH-PERFORMANCE COHERENCE DOMAINS IN A MULTIPROCESSOR SYSTEM"; U.S. patent application Ser. No. 11/768,857, now U.S. Pat. No. 7,827,391 issued Nov. 2, 2010 for "METHOD AND APPARATUS FOR SINGLE-STEPPING COHERENCE EVENTS IN A MULTIPROCESSOR SYSTEM UNDER SOFTWARE CONTROL"; U.S. patent application Ser. No. 11/768,547, now U.S. Pat. No. 7,669,012 issued Feb. 23, 2010 for "INSERTION OF COHERENCE EVENTS INTO A MULTIPROCESSOR COHERENCE PROTOCOL"; U.S. patent application Ser. No. 11/768,791, now U.S. Pat. No. 7,680,971 issued Mar. 16, 2010 for "METHOD AND APPARATUS TO DEBUG AN INTEGRATED CIRCUIT CHIP VIA SYNCHRONOUS CLOCK STOP AND SCAN"; U.S. patent application Ser. No. 11/768,795, now U.S. Pat. No. 7,802,025 issued Sep. 21, 2010 for "DMA ENGINE FOR REPEATING COMMUNICATION PATTERNS"; U.S. patent application Ser. No. 11/768,799, now U.S. Pat. No. 7,680,971 issued Mar. 16, 2010 for "METHOD AND APPARATUS FOR A CHOOSE-TWO MULTI-QUEUE ARBITER"; U.S. patent application Ser. No. 11/768,800, for "METHOD AND APPARATUS FOR EFFICIENTLY TRACKING QUEUE ENTRIES RELATIVE TO A TIMESTAMP"; U.S. patent application Ser. No. 11/768,572, now U.S. Pat. No. 7,701,846 issued Apr. 20, 2010 for "BAD DATA PACKET CAPTURE DEVICE"; U.S. patent application Ser. No. 11/768,593, for "EXTENDED WRITE COMBINING USING A WRITE CONTINUATION HINT FLAG"; U.S. patent application Ser. No. 11/768,805, now U.S. Pat. No. 7,793,038 issued Sep. 7, 2010, for "A SYSTEM AND METHOD FOR PROGRAMMABLE BANK SELECTION FOR BANKED MEMORY SUBSYSTEMS"; U.S. patent application Ser. No. 11/768,905, now U.S. Pat. No. 7,761,687 issued Jul. 20, 2010, for "AN ULTRASCALABLE PETAFLOP PARALLEL SUPERCOMPUTER"; U.S. patent application Ser. No. 11/768,810, now U.S. Pat. No. 8,108,738 issued Jan. 31, 2012 for "SDRAM DDR DATA EYE MONITOR METHOD AND APPARATUS"; U.S. patent application Ser. No. 11/768,812, now U.S. Pat. No. 7,797,503 issued Sep. 14, 2012 for "A CONFIGURABLE MEMORY SYSTEM AND METHOD FOR PROVIDING ATOMIC COUNTING OPERATIONS IN A MEMORY DEVICE"; U.S. patent application Ser. No. 11/768,559, now U.S. Pat. No. 8,010,875 issued Aug. 30, 2011, for "ERROR CORRECTING CODE WITH CHIP KILL CAPABILITY AND POWER SAVING ENHANCEMENT"; U.S. patent application Ser. No. 11/768,552, now U.S. Pat. No. 7,873,843, for "STATIC POWER REDUCTION FOR MIDPOINT-TERMINATED BUSSES"; U.S. patent application Ser. No. 11/768,669, now U.S. Pat. No. 7,984,448 issued Jul. 19, 2011 for "A MECHANISM TO SUPPORT GENERIC COLLECTIVE COMMUNICATION ACROSS A VARIETY OF PROGRAMMING MODELS"; U.S. patent application Ser. No. 11/768,813, now U.S. Pat. No. 8,032,92 issued Oct. 4, 2011 for "MESSAGE PASSING WITH A LIMITED NUMBER OF DMA BYTE COUNTERS"; U.S. patent application Ser. No. 11/768,619, now U.S. Pat. No. 7,738,443 issued Jun. 15, 2010 for "ASYNCRONOUS BROADCAST FOR ORDERED DELIVERY BETWEEN COMPUTE NODES IN A PARALLEL COMPUTING SYSTEM WHERE PACKET HEADER SPACE IS LIMITED"; U.S. patent application Ser. No. 11/768,682, for "HARDWARE PACKET PACING USING A DMA IN A PARALLEL COMPUTER"; and U.S. patent application Ser. No. 11/768,752, now U.S. Pat. No. 8,001,401 issued Aug. 16, 2011 for "POWER THROTTLING OF COLLECTIONS OF COMPUTING ELEMENTS".

GOVERNMENT RIGHTS

This invention was made with Government support under Contract No.: B554331, awarded by Department of Energy. The Government has certain rights to this invention.

BACKGROUND OF THE INVENTION

1. Field of the Invention

This invention generally relates to computer memory systems, and more specifically, to content protection of computer memory using redundancy.

2. Background Art

The small size of computer transistors and capacitors, combined with transient electrical and electromagnetic phenomena, cause occasional errors in stored information in computer memory systems. Therefore, even well designed and generally reliable memory systems are susceptible to memory device failures.

In an effort to minimize the effects of these memory device failures, various error-checking schemes have been developed to detect, and in some cases correct, errors in messages read from memory. Many of these checking schemes use redundant information, stored in the computer memory, to ensure data integrity. The simplest error detection scheme is the parity bit. A parity bit is an extra bit included with a binary data message or data word to make the total number of 1's in the message either odd or even. For "even parity" systems, the parity bit is set to make the total number of 1's in the message even. For "odd parity" systems, the parity bit is set to make the total number of 1's in the message odd. For example, in a system utilizing odd parity, a message having two 1's would have its parity bit set to 1, thereby making the total number of 1's odd. Then, the message including the parity bit is transmitted and subsequently checked at the receiving end for errors. An error results if the parity of the data bits in the message does not correspond to the parity bit transmitted. As a result, single bit errors can be detected. However, since there is no way to detect which particular bit is in error, correction is not possible. Furthermore, if two or any even number of bits are in error, the parity will be correct and no error will be detected. Parity therefore is capable of detecting only odd numbers of errors and is not capable of correcting any bits determined to be in error.

Error correction codes (ECCs) have thus been developed to not only detect but also correct bits determined to be in error. ECCs utilize multiple parity check bits stored with the data message in memory. Each check bit is a parity bit for a group of bits in the data message. When the message is read from memory, the parity of each group, including the check bit, is evaluated. If the parity is correct for all of the groups, it signifies that no detectable error has occurred. If one or more of the newly generated parity values are incorrect, a unique pattern called a syndrome results, which may be used to identify the bit in error. Upon detection of the particular bit in error, the error may be corrected by complementing the erroneous bit.

A widely used type of ECC utilized in error control in digital systems is based on the codes devised by R. W. Hamming, and thus take the name "Hamming codes". One particular subclass of Hamming codes includes the single error correcting and double error detecting (SEC-DED) codes. As their name suggests, these codes may be utilized not only to correct any single bit error but also to detect double bit errors.

Another type of well-known ECC is the single symbol correction and double symbol detection (SSC-DSD) codes, which are used to correct single symbol errors and detect double symbol errors. In systems implementing these types of codes, the symbol represents a multiple bit package or chip. Hence, as the name implies, an SSC-DSD code in a system utilizing n bit symbols would be capable of correcting n bits in a single symbol and detecting errors occurring in double symbols.

Error detecting codes have a low overhead, e.g., 12.5% parity overhead for single byte. Error correcting codes are very inefficient for small data items and are usually used for groups of 8 bytes and larger, e.g., 12.5% overhead for single error correcting, double correcting code on 8 bytes. If a fraction of the group is changed, the unchanged data needs to be retrieved to generate the ECC for the entire group, causing expensive Read-Modify Write cycles.

For example, in a 32-bit ECC scheme, the check bits that are stored with the data are generated based on the entire thirty-two bits. This makes it necessary to regenerate all of the check bits if even one data bit has changed. Thus, if one byte of data needs to be written to memory, the entire 4-byte double word must first be read, checked and corrected, the new eight bits substituted, and then all four bytes must be rewritten to memory with the appropriate new check bits. The same is true if two or three bytes of data need to be written to memory. This is called a partial write or a read/modify/write operation.

A large number of these Read-Modify-Write cycles can cause significant delays in the operation of the memory system. This problem is usually mitigated by implementing write-combine buffers. These buffers collect multiple update requests and combine them, if possible, into larger updates, possibly changing the entire ECC protected group at once.

SUMMARY OF THE INVENTION

An object of this invention is to provide combined group ECC protection and subgroup parity protection.

Another object of the present invention is to generate a code that provides error correction capabilities for a group of data as well as parity protection for fractions of that group.

A further object of the invention is to generate a code that simultaneously represents ECC on a group of bits and parity across subgroups of these bits.

These and other objectives are attained with a method of and system for providing combined error code protection and subgroup parity protection for a given group of n bits. The method comprises the steps of identifying a number, m, of redundant bits for said error protection; and constructing a matrix P, wherein multiplying said given group of n bits with P produces m redundant error correction code (ECC) protection bits, and two columns of P provide parity protection for subgroups of said given group of n bits.

In the preferred embodiment of the invention, the matrix P is constructed by generating permutations of m bit wide vectors with three or more, but an odd number of, elements with value one and the other elements with value zero; and assigning said vectors to rows of the matrix P. Also, preferably, this matrix P fulfills the following conditions: (i) all elements of P are either one or zero; (ii) the elements of columns p0 to pk are non equal to zero for rows for which said columns provide parity protection, and otherwise the elements of said columns p0 to pk are zero; (iii) each row has an odd number of one-elements; and (iv) each row has at least three one-elements.

Further benefits and advantages of the present invention will become apparent from a consideration of the following detailed description, given with reference to the accompanying drawings, which specify and show preferred embodiments of the invention.

BRIEF DESCRIPTION OF THE PREFERRED EMBODIMENTS

DETAILED DESCRIPTION OF THE PREFERRED EMBODIMENTS

Figure 1:
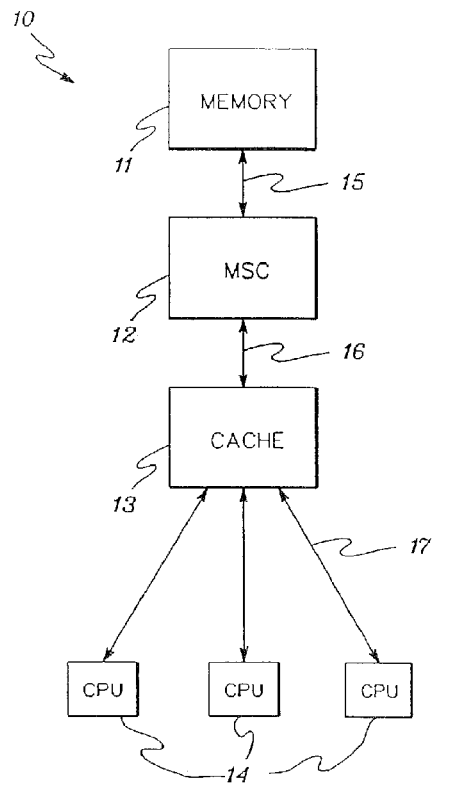
FIG. 1 depicts one example of a computer system in which the present invention may be implemented.

FIG. 1 shows a block diagram representation of a computer system 10 utilizing the error correction code of the present invention. In this embodiment, computer system 10 includes a memory 11 connected to a main storage controller (MSC) 12 via a data bus 15, a cache 13 connected to MSC 12 via a data bus 17, and a plurality of central processing units (CPUs) 14 connected to cache 13 via data buses 17. Data buses 16 and 17 may typically be 72 bits wide. Communication of data between memory 11 and MSC 12, on the other hand, occurs via data bus 15. Thus, data bus 15 facilitates the transmission of data read from memory 11 by MSC 12 as well as data written to memory 11 by MSC 12.

Data bus 15, in one embodiment, is 160 bits wide but nevertheless may vary in width according to the requirements of the particular system while still receiving error protection under the ECC of the present invention. In this regard, the ECC of the present invention is specifically designed to meet the data requirements of a wide variety of servers including data buses having widths of, for example, 140, 142, 143, 144, 152, and 162 bits.

The data transmitted in computer system 10 is arranged into a data word having a size dependent on the particular data bus utilized by the system. Furthermore, the data word may be arranged into variably sized symbols. For instance, in one example, the data word comprises a plurality of two bit symbols. Hence, in this example, a 146-bit data word would include 73 symbols.

Figure 2:
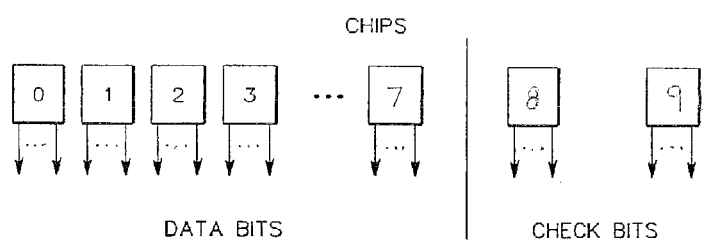
FIG. 2 illustrates one example of a memory arrangement with which the present invention may be used.

With reference to FIG. 2, a representative memory system may use, for example, ten memory chips that are 16 bits wide. Eight chips are used to hold user data, and the remaining two chips contain ECC check information along with system data. Each single memory access returns 160 bits of data, referred to as a line of data. The preferred error correcting code used with the present invention is defined over two sequential memory accesses to all the chips (2 lines), so from the eight user data chips, in total there are 256 (8×16×2) bits of user data. The extra two chips may provide 64 bits (2×16×2) bits, and 54 of these bits may be allocated for ECC check information, leaving ten bits for system information.

Figure 3:
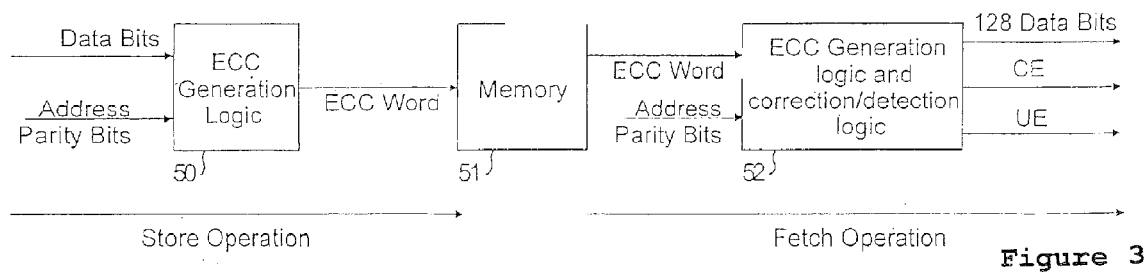
FIG. 3 is a block diagram depicting data store and fetch operations implementing a single error correcting double error detecting methodology.

FIG. 3 is a block diagram depicting data store and fetch operations implementing a preferred ECC methodology. More specifically, FIG. 3 is a high-level diagram depicting the movement of data through the ECC generation logic, out to memory, back from memory, and through the ECC detection/correction logic. As shown in FIG. 3, the data bits and address parity bits are fed into an ECC generation logic unit 50, implementing a parity check for producing the ECC word comprising the data bits and a group of check bits. The ECC word is stored in a memory storage 51, for example. During a subsequent read operation, the ECC word is fetched from memory 51, and an ECC correction/detection logic unit 52 is implemented to determine if there are any errors. If there are no errors, the data bits are passed on to the next stage in the computer system. If there are errors, the ECC correction/detection logic unit will detect them providing that no more than two symbols are in error, and correct them if a single symbol is in error. The detection/correction logic signals the system via CE and UE signals when a respective "correctable" or "uncorrectable" error occurs.

In accordance with the preferred embodiment of the present invention, the ECC is based on a single error correction double error detect (SECDED) ECC. A group of n bits is protected by m redundant bits using a n×(n+m) generator matrix $G=[I_n\ P]$. Multiplying an n bit wide data word with P produces the m redundant protection bits. Columns p0 to pk of P are selected to provide parity for subgroups.

P preferably fulfills the following conditions:
 i) All elements are either 1 or 0;
 ii) The elements of columns p0 to pk must be non-equal to zero for rows for which they provide parity and zero otherwise;
 iii) Each row must have an odd number of one-elements; and
 iv) Each row must have at least 3 one-elements.

P is constructed by generating permutations of m bit wide vectors with 3 or more, but an odd number of, elements with value one and the other elements of value 0. These vectors are assigned to rows of P while adhering to the above conditions. If not all rows of P can be assigned, m needs to be increased by one and the entire process needs to be restarted.

Figures 4, 5:
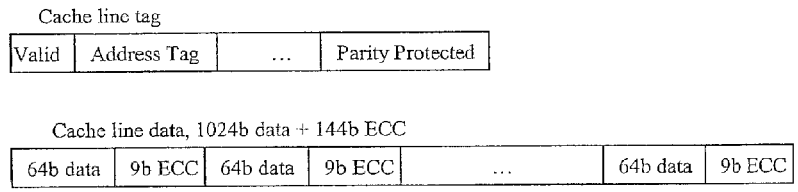
FIG. 4 shows an ECC checkbits generator matrix P which generates ECC protection and parity protection in accordance with the present invention.
FIG. 5 illustrates a parity protected cache line.

FIG. 4 shows, as a preferred embodiment, a checkbits generator matrix P that provides SECDED ECC protection for 64 b groups. The columns p0 and p1 of the matrix generate parity for the first 32 b of the group while columns p2 and p3 provide parity protection for the second 32 b subgroup.

Also, in accordance with a preferred embodiment of the invention, a storage subsystem is provided that can take advantage of the properties of the above ECC code as follows:
 i) If an entire n-bit group is changed, the m-bit ECC for this group is generated and stored along with the group;
 ii) If only a fraction of the group, but one or multiple entire, parity protected subgroups are changed, only this fraction and the parity bits protecting them are stored, the rest remains unchanged. The entire group is now only protected by the parity bits generated by columns p0 to pk. The fact that only parity protection is valid is recorded for this group or for the storage region including this group; and
 iii) In all other cases, the unmodified components of the group are first read and merged with the modified content. Then the entire m-bit ECC for this group is generated and stored along with the group.

When retrieving data and ECC, the information indicating whether this group is only parity protected is also retrieved. If it is only parity protected, only the bits generated by columns p0 to pk are checked and an uncorrectable error is signaled in case of a mismatch. Otherwise, error detection and correction can proceed as for a regular SECDED ECC.

To balance the need of high throughput subgroup modifications avoiding RMW cycles with data protection of a correcting code, the storage can be scrubbed periodically to convert parity-only protected data to ECC protected data.

FIG. 5 shows a preferred embodiment. A cache stores its cache lines along with ECC checkbits. It also stores a parity-protect bit for each cache line in its directory that determines if at least one fraction of the line is protected by parity only. The parity protect bit is set to '0' when the line is established on a miss and fetched from main memory. It is set to '1' whenever only a 32 b word is written to the cache line. It is cleared when a background scrub process, which continuously scans the directory for asserted parity-protect bits, reads a whole line, regenerates all ECC fields and writes the line back into the cache.

As will be readily apparent to those skilled in the art, the present invention or aspects of the invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out methods described herein. Alternatively, a specific use computer, containing specialized hardware for carrying out one or more of the functional tasks of the invention, could be utilized.

The present invention or aspects of the invention can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A tangible computer readable hardware storage device, tangibly embodying computer readable code for providing an error correction code and parity protection for a given group of bits, wherein the given group of the bits comprises a plurality of subgroups of the bits, the computer readable code, when executing in a computer system, performing the following:

using a specified error correction code checkbits generator matrix P comprising a plurality of rows and a plurality of columns to provide an error correction code and parity bits, including using the specified error correction code checkbits generator matrix P to provide an error correction code (ECC) for the given group of bits; and using two of the columns of said error correction code checkbits generator matrix P to provide parity bits for parity protection across the subgroups of said given group of bits.

2. The computer readable storage device according to claim 1, wherein said matrix P is constructed by generating m bit wide vectors with three or more, but an odd number of, elements with value one and the other elements with value zero, and assigning said vectors to the rows of the matrix P.

3. A method of providing an error correction code and parity protection for a given group of bits, wherein the given group of bits comprises a plurality of subgroups of the bits, the method comprising:

using a specified error correction code checkbits generator matrix P comprising a plurality of rows and a plurality of columns to provide an error correction code and parity bits, including using the specified error correction code checkbits generator matrix P to provide an error correction code (ECC) for the given group of bits; and using two of the columns of said error correction code checkbits generator matrix P to provide parity bits for parity protection across the subgroups of said given group of bits.

4. The method according to claim 3, wherein said matrix P is constructed by generating m bit wide vectors with three or more, but an odd number of, elements with value one and the other elements with value zero, and assigning said vectors to the rows of the matrix P.

5. The method according to claim 3, comprising the further step of:

using a computer system, implementing a code providing algorithm, for performing the using the specified matrix P to provide the error correction code and the using two of the columns of said matrix P to provide parity bits for parity protection.

6. The method according to claim 3, wherein the using the specified matrix P to provide on error correction code includes:

identifying a number, m, of redundant bits for said error correction code; and multiplying said given group of bits with the matrix P to produce m redundant error correction code protection bits.

7. The method according to claim 3, wherein the matrix P simultaneously represents ECC on the group of bits and party across subgroups of said group bits.

8. The method according to claim 3, wherein:

the group of bits includes n bits; and the using the specified error correction code checkbits generator matrix P includes using m redundant bits to protect said group of n bits, and generating the m redundant bits by multiplying an n bit wide data word with P.

9. A system for providing an error correction code and parity protection for a given group of bits, wherein the given group of bits comprises a plurality of subgroups of the bits, the system comprising:

one or more processing units configured for:

using a specified error correction code checkbits generator matrix P comprising a plurality of rows and a plurality of columns to provide an error correction code and parity bits, including using the specified error correction code checkbits generator matrix P to provide an error correction code (ECC) for the given group of bits; and using two of the columns of said error correction code checkbits generator matrix P to provide parity bits for parity protection across the subgroups of said given group of bits.

10. The system according to claim 9, wherein:

said matrix is constructed by generating m bit wide vectors with three or more, but an odd number of, elements with value one and the other elements with value zero, and assigning said vectors to the rows of the matrix P.

* * * * *